United States Patent
Lin et al.

(10) Patent No.: US 6,733,617 B2
(45) Date of Patent: May 11, 2004

(54) DIRECT DETECTION OF DIELECTRIC ETCH SYSTEM MAGNET DRIVER AND COIL MALFUNCTIONS

(75) Inventors: Mu-Tsang Lin, Chung-hua (TW); Tse-Lun Chang, Taoyung (TW); Sen-Tay Chang, Taichung (TW); Yao-Ping Yang, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 174 days.

(21) Appl. No.: 09/903,130

(22) Filed: Jul. 11, 2001

(65) Prior Publication Data

US 2003/0016035 A1 Jan. 23, 2003

(51) Int. Cl.$^7$ .......................... H05H 1/00; C23C 16/00
(52) U.S. Cl. .......................... 156/345.24; 156/345.46; 156/345.49; 118/723 MR; 118/723 MA
(58) Field of Search .......................... 156/345.24, 345.4, 156/345.44, 345.46, 345.49; 118/723 MR, 723 MA, 723 FI; 204/298.16, 298.32, 298.37; 324/750

(56) References Cited

U.S. PATENT DOCUMENTS 5,474,648 A * 12/1995 Patrick .................... 156/627.1
6,545,468 B2 * 4/2003 Kuo et al. .................. 324/226

* cited by examiner

*Primary Examiner*—Parviz Hassanzadeh
(74) *Attorney, Agent, or Firm*—Tung & Associates

(57) ABSTRACT

The direct detection of dielectric etch system magnet driver and coil malfunctions is disclosed. A dielectric etch system includes a plasma chamber in which a semiconductor wafer is placed to remove dielectric therefrom, and a number of coils positioned around the chamber to excite the plasma. Magnet drivers of a magnet driver circuitry provide configurable preset current from a power source to the coils. Malfunction detection circuitry includes a number of comparators connected in parallel. Each comparator couples between one of the magnet drivers and one of the coils. A relay couples the comparators to ground, and turns off the power source when any of the comparators yields a substantially non-zero current, which indicates that either the driver or the coil coupled to the comparator is malfunctioning.

6 Claims, 6 Drawing Sheets

DIRECT DETECTION OF DIELECTRIC ETCH SYSTEM MAGNET DRIVER AND COIL MALFUNCTIONS

FIELD OF THE INVENTION

This invention relates generally to magnet drivers, such as magnet drivers for dielectric etch systems, and particularly to the detection of malfunctions within such drivers.

BACKGROUND OF THE INVENTION

There are four basic operations in semiconductor processing, layering, patterning, doping, and heat treatments. Layering is the operation used to add thin layers to the surface of a semiconductor wafer. Patterning is the series of steps that results in the removal of selected portions of the layers added in layering. Doping is the process that puts specific amounts of dopants in the wafer surface through openings in the surface layers. Finally, heat treatments are the operations in which the wafer is heated and cooled to achieve specific results, where no additional material is added or removed from the wafer.

Of these four basic operations, patterning is typically the most critical. The patterning operation creates the surface parts of the devices that make up a circuit on the semiconductor wafer. The operation sets the critical dimensions of these devices. Errors during patterning can cause distorted or misplaced defects that result in changes in the electrical function of the device, as well as device defects.

Figure 1A:
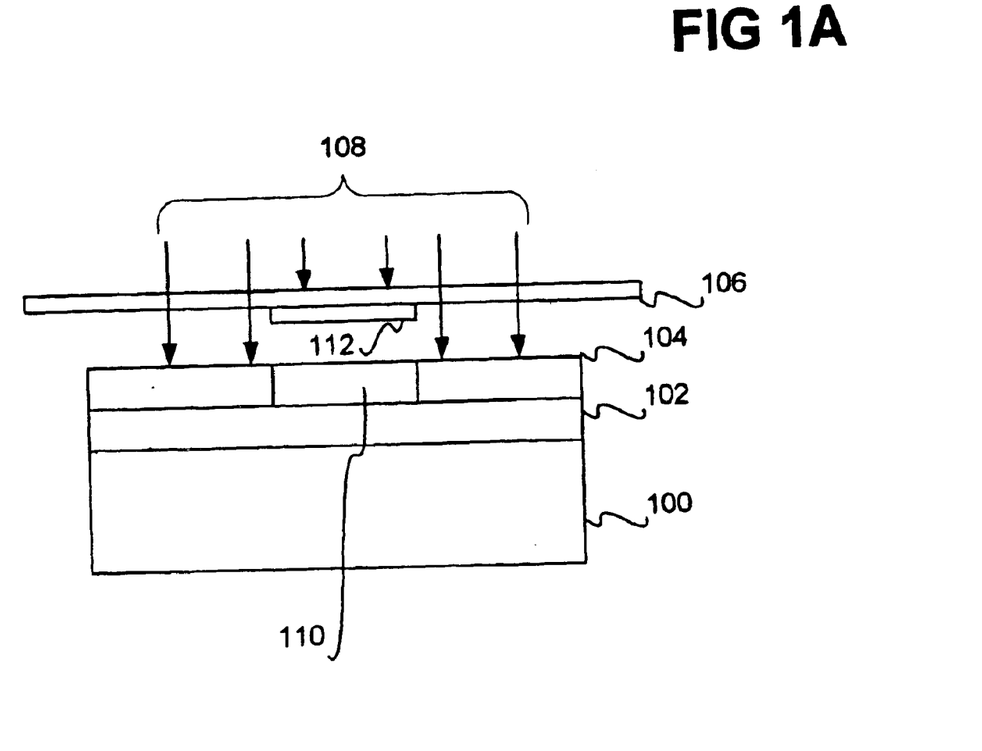
FIGS. 1A, 1B, 1C, and 1D are diagrams illustrating the general patterning process performed in semiconductor manufacture.

The patterning process is also known by the terms photomasking, masking, photolithography, and microlithography. The process is a multi-step process similar to photography or stenciling. The required pattern is first formed in photomasks and transferred into the surface layers of the semiconductor wafer. This is shown by reference to FIGS. 1A and 1B. In FIG. 1A, the wafer 100 has an oxide layer 102 and a photoresist layer 104. The wafer 100 itself may be referred to as the silicon or semiconductor substrate. The oxide layer 102 is a dielectric, which is a material that conducts no current when it has a voltage across it. Oxide, or more specifically silicon dioxide, is one type of dielectric, whereas another type is silicon nitride.

Figure 1B:
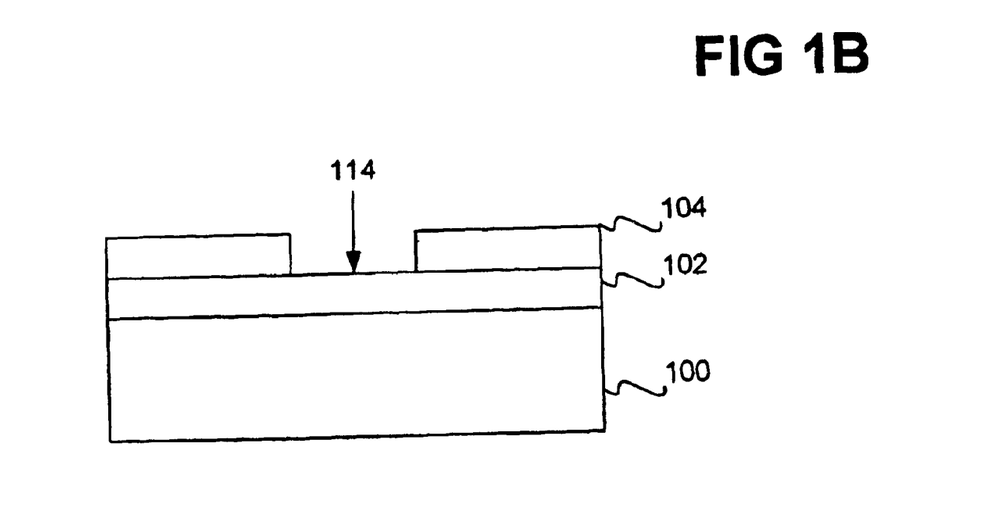

A mask 106 is precisely aligned over the wafer 100, and the photoresist 104 is exposed, as indicated by the arrows 108. This causes the exposure of the photoresist layer 104, except for the part 110 that was masked by the part 112 of the mask 106. In FIG. 1B, the unexposed part 110 of the photoresist layer 104 is removed, creating a hole 114 in the photoresist layer 104.

Figure 1C:
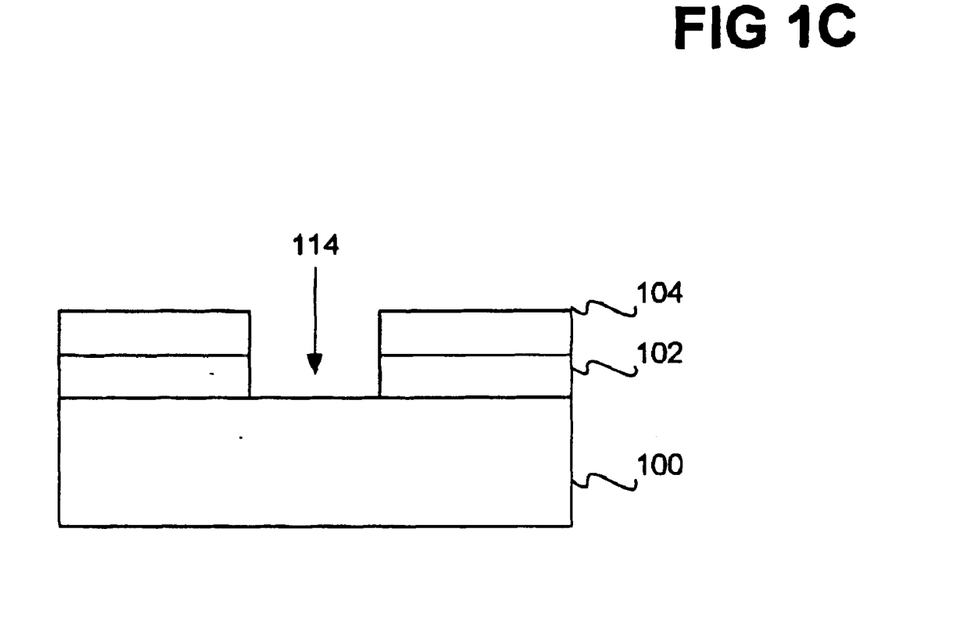
Figure 1D:
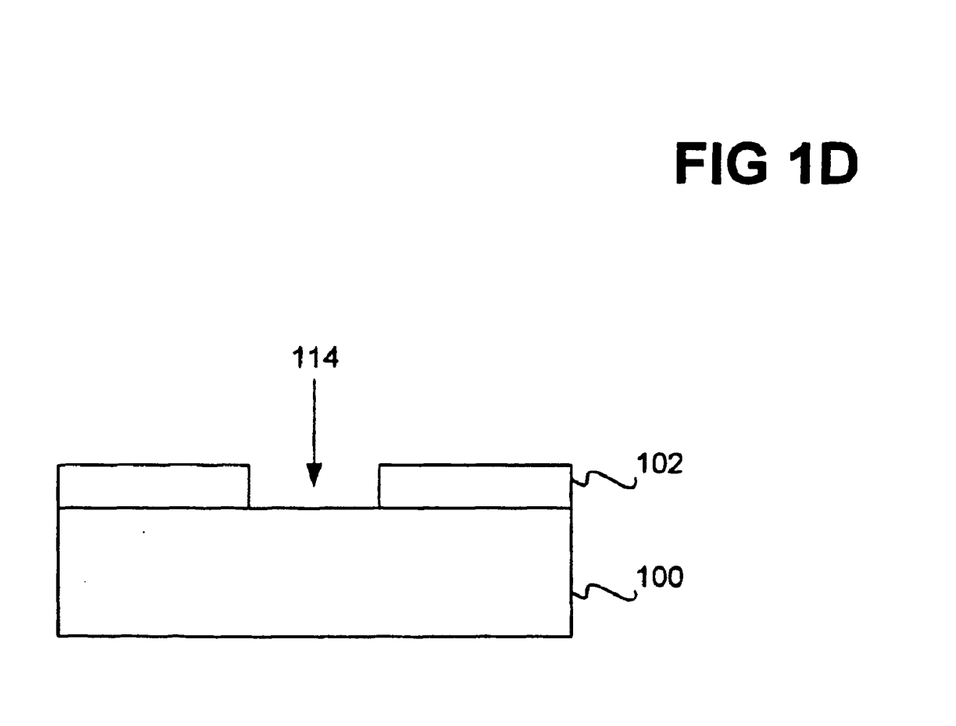

Next, a second transfer takes place from the photoresist layer 104 into the oxide layer 102. This is shown in FIG. 1C, where the hole 114 extends through both the photoresist layer 104 and the oxide layer 102. The transfer occurs when etchants remove the portion of the wafer's top layer that is not covered by photoresist. The chemistry of photoresists is such that they do not dissolve, or dissolve very slowly, in the chemical etching solutions. Finally, the photoresist layer 104 is removed, as shown in FIG. 1D, such that only the wafer 100 and the oxide layer 102 with the hole 114 remains.

The removal of the photoresist layer can be accomplished by either wet or dry etching. Wet etching refers to the use of wet chemical processing to remove the photoresist. The chemicals are placed on the surface of the wafer, or the wafer itself is submerged in the chemicals. Dry etching refers to the use of plasma stripping, using a gas such as oxygen ($O_2$), $C_2F_6$ and $O_2$, or another gas. Whereas wet etching is a low-temperature process, dry etching is typically a high-temperature process.

In one type of dry etching process, the wafer is placed within a chamber and is exposed to plasma. The plasma has its temperature modified by being subjected to electromagnetic fields. Precise control of the fields allows for proper stripping, or etching, of the dielectric from the semiconductor wafer. More specifically, plasma etching is performed by applying electrical and/or magnetic fields to a gas containing some chemically reactive element, like fluorine or chlorine. The plasma releases chemically reactive ions that can remove, or etch, materials very rapidly. It also gives the chemicals an electrical charge that directs them toward the wafer vertically.

Figure 2:
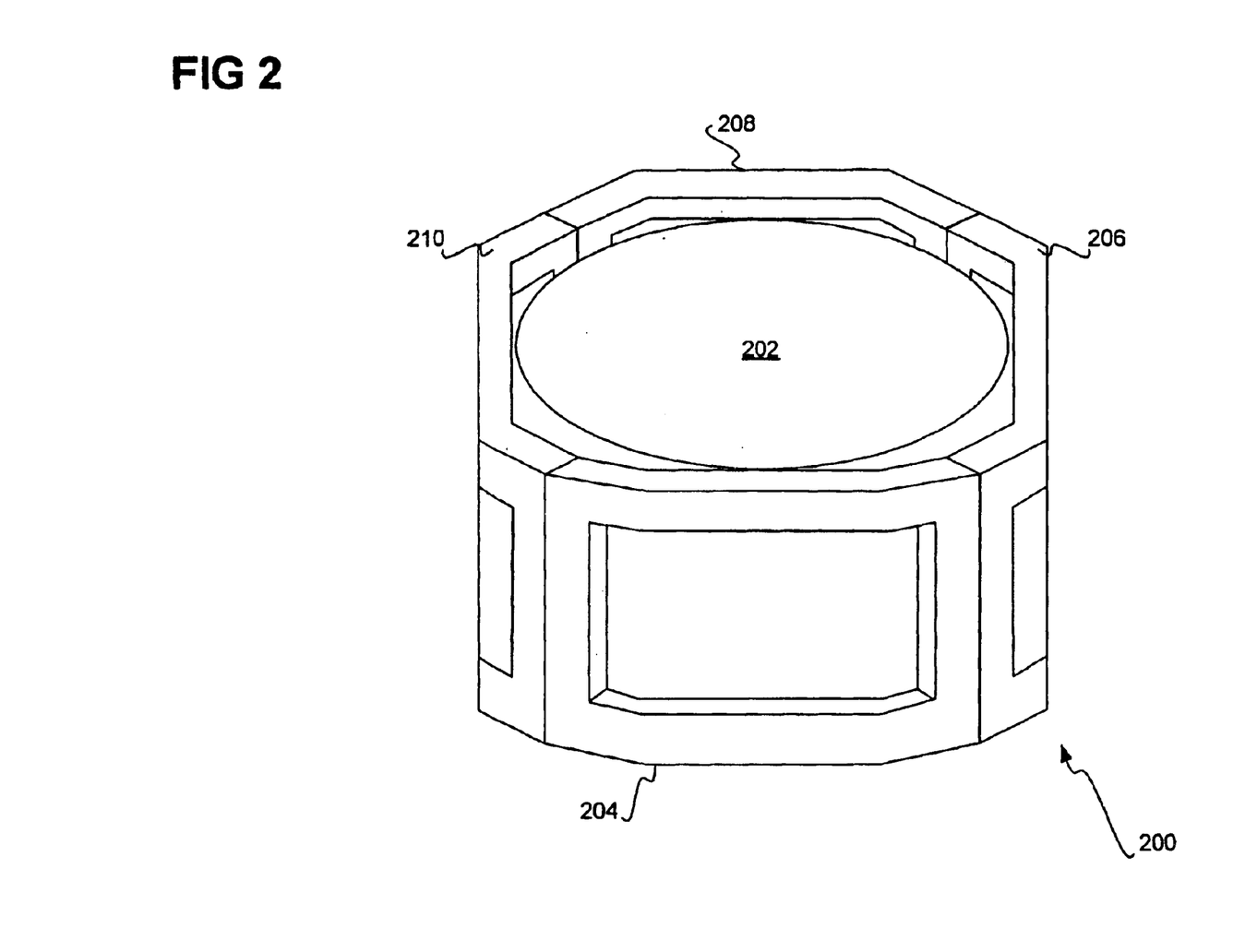
FIG. 2 is a diagram showing an example dielectric etch system having a number of coils surrounding a plasma chamber.

FIG. 2 shows an example of a dielectric etch system 200. The system 200 includes a chamber 202 surrounded by electromagnetic coils 204, 206, 208, and 210. Applying different currents at different times to various of the coils 204, 206, 208, and 210 produces varying magnetic fields within the chamber 202, providing for proper electric etching of the wafer placed inside the chamber 202. The coils 204, 206, 208, and 210 are also referred to as channels. Examples of dielectric etch systems include the eMxP+, the eMax, and others available from Applied Materials Taiwan (AMT), of Taiwan.

If the dielectric etch system fails, semiconductor wafers placed in the system chamber can be damaged. For example, too much or not enough dielectric may be removed, or some of the silicon substrate may also be removed. Typically, the edges of the wafer are damaged, as compared to other parts of the wafer. This reduces the number of semiconductor devices that can be delivered from the wafer. That is, the yield of the wafer may be reduced if the dielectric etch system fails.

Figure 3:
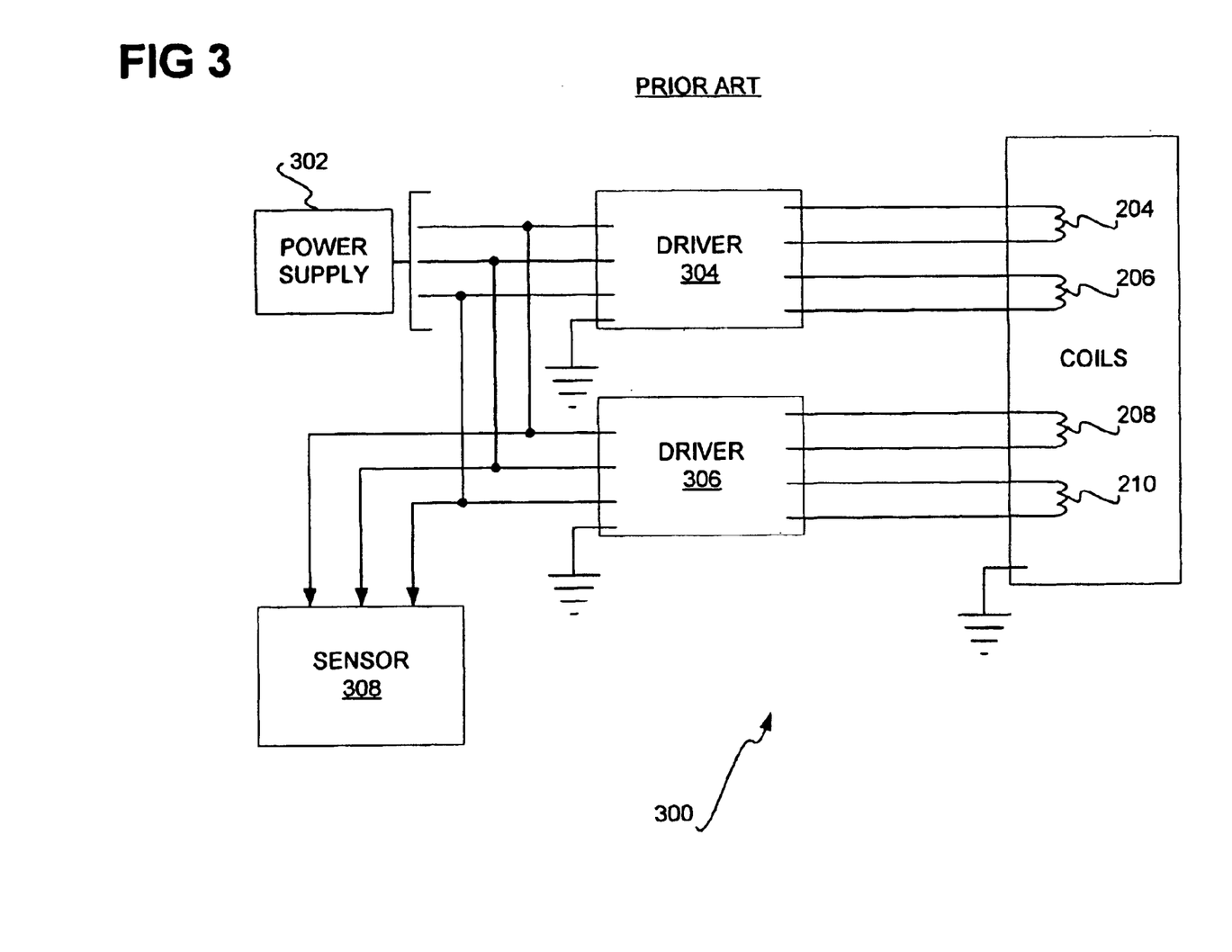
FIG. 3 is a diagram showing the magnet driver circuitry of an etch system, such as the etch system of FIG. 2, and how the prior art indirectly detects malfunctions within the etch system.

As a result, most dielectric etch systems include a detector to detect when a malfunction or failure, where these terms are used synonymously herein, occurs. For example, FIG. 3 shows driver circuitry 300 for the etch system 200 of FIG. 2 which includes a current sensor 308 to detect malfunctions. A three-phase power supply 302 powers both drivers 304 and 306, which are configured to send the correct amount of power to the coils 204, 206, 208, and 210, so that proper etching occurs within the chamber (not shown in FIG. 3). The current sensor 308 measures the current being input directly into the drivers 304 and 306, and therefore ideally detects indirectly whether one or more of the drivers 304 and 306 and the coils 204, 206, 208, and 210 are malfunctioning.

The current sensor 308 detects malfunctions in the drivers 304 and 306 and/or the coils 204, 206, 208, and 210 by, for a minimum magnetic field and a minimum current rise being generated. This means, however, that the sensor 308 is detecting failure in an indirect manner. Rather than the drivers 304 and 306 or the coils 204, 206, 208, and 210 being directly monitored, they are indirectly monitored by measuring the current fed into the drivers 304 and 306. As a result, the sensor 308 may detect catastrophic failure, where, for instance, all the coils 204, 206, 208, and 210 fail, but may not detect less major failures, such as where only one of the coils 204, 206, 208, and 210 malfunctioning. However, even one of the coils 204, 206, 208, and 210 failing can damage semiconductor wafers in the manner that has been described.

The following table shows an example of the lack of failure detection of current detection technology, such as the current sensor 308 of FIG. 3.

| | Minimum field | Minimum current rise | Driver failure detected? | One channel failure detected? | Driver decay detected? |
|---|---|---|---|---|---|
| Setting 1 | 10 gauss | 0.01 A | No | No | No |
| Setting 2 | 10 gauss | 0.05 A | Yes | No | No |
| Setting 3 | 10 gauss | 0.1 A | Yes | Yes | No |

The three rows of the table correspond to three different settings. Each setting has a minimum magnetic field of 10 gauss. The settings as to minimum current rise vary, where settings one, two, and three are set to 0.01 amps, 0.05 amps, and 0.1 amps, respectively. The driver failure detected column indicates whether, for a given setting, driver failure is detected by the current sensor 308. The one channel failure detected column indicates whether, for a given setting, the failure of just one coil is detected by the sensor 308. Finally, the driver decay detected column indicates whether, for a given setting, driver decay is detected by the sensor 308. Driver decay can be, for instance, when the current output by the driver is decaying in an improper or malfunctioning manner.

As shown in the table, the current sensor 308 for the first setting cannot detect driver failure, failure of a single coil, or driver decay. For the second setting, the sensor 308 can detect driver failure, but not the failure of a single coil, or driver decay. The sensor 308 for the third setting can detect driver failure and the failure of a single coil, but still cannot detect driver decay. This inability of the current sensor 308 to detect these single-point failures is largely attributed to its indirect manner of detection, where only the current being input into the drivers 304 and 306 is measured.

As has been indicated, the inability to detect malfunctions negatively affects semiconductor wafer yield. This can cause significant cost overruns, especially when a malfunction is not manually noticed for a long period, such that a large number of wafers are damaged before correction of the problem. Therefore, there is a need to better detect malfunctions in the magnetic driver circuitry of dielectric etch systems than the indirect current measurement approach of the prior art. Specifically, there is a need to detect the failure of a driver or a single channel. Preferably, the fulfillment of these needs would not require modification of the driver circuitry or the etch system itself, so the etch system itself does not have to be replaced or modified. For these and other reasons, there is a need for the present invention.

SUMMARY OF THE INVENTION

The invention relates to direct detection of dielectric etch system magnet driver and coil malfunctions. A dielectric etch system has a plasma chamber in which a semiconductor wafer is placed to remove dielectric therefrom, and a number of coils positioned around the chamber to excite the plasma. Magnet drivers of a magnet driver circuitry provide configurable preset current from a power source to the coils. Malfunction detection circuitry includes a number of comparators connected in parallel. Each comparator couples between one of the magnet drivers and one of the coils. A relay couples the comparators to ground, and turns off the power source when any of the comparators yields a substantially non-zero current, which indicates that either the driver or the coil coupled to the comparator is malfunctioning.

For instance, in one embodiment, there is a normally open switch coupling the relay to the power source. The relay closes the normally open switch when any of the comparators yields the substantially non-zero current. The relay may itself have a normally open switch between the other normally open switch and a negative voltage. The substantially non-zero current from the comparators causes the relay's normally open switch to close, which in turn closes the other normally open switch. The malfunctions that can be detected by embodiments of the invention include driver decay, driver failure, coil failure, or other types of malfunctions.

The invention provides for advantages not found within the prior art. Significantly, the malfunction detection circuitry of the invention directly monitors the current between the drivers and the coils, instead of indirectly monitoring the current as is done in the prior art. The invention provides for detection of single-point failures of one of the drivers or coils. This is in distinction to the prior art, which generally may only be able to detect catastrophic failure of all the drivers or all the coils. Still other advantages, aspects, and embodiments of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 4:
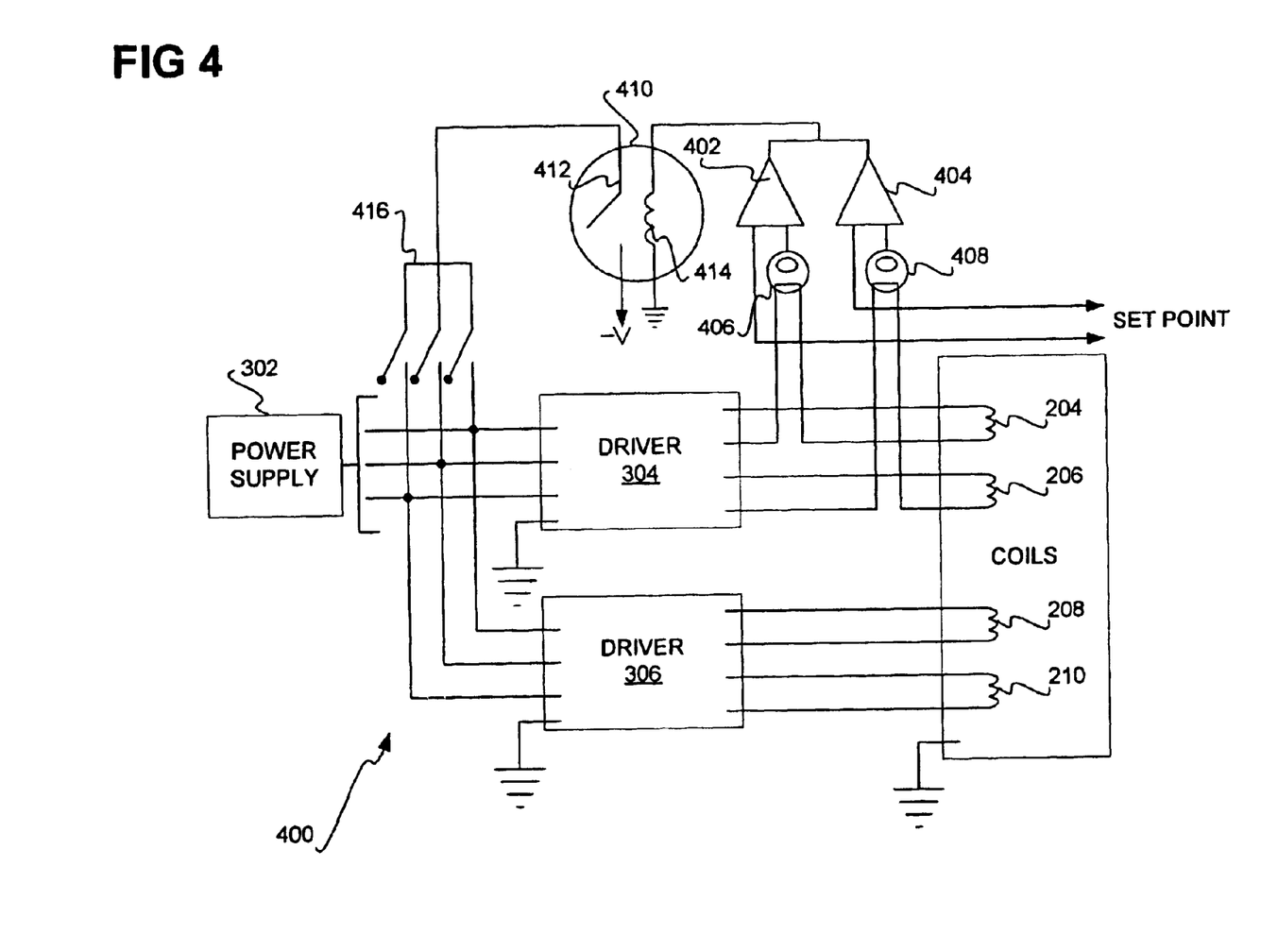
FIG. 4 is a diagram showing the magnet driver circuitry of an etch system, such as the etch system of FIG. 2, and how the invention directly detects malfunctions within the etch system.

FIG. 4 shows driver circuitry for the dielectric etch system 200 of FIG. 2 that includes malfunction detection circuitry according to the invention. The power supply 302 powers the magnet drivers 304 and 306. The power supply 302 is preferably a 208-volt, three-phase power supply. The magnet drivers 304 and 306 provide a configurable preset current from the power supply 302 to the plurality of coils 204, 206, 208, and 210. As shown in FIG. 4, preferably the magnet driver 304 provides current to the coils 204 and 206, and the magnet driver 306 provides current to the coils 208 and 210. There may be more or less coils and magnet drivers than the number depicted in FIG. 4.

The malfunction detection circuitry includes comparators 402 and 404, hole sensors 406 and 408, a relay 410, and a normally open switch 416. The comparator 402 couples between the driver 304 and the coil 204, whereas the comparator 404 couples between the driver 304 and the coil 206. There may also be comparators coupling between the driver 306 and the coils 208 and 210, but, in the embodiment of FIG. 4, there are none. The comparators 402 and 404 directly monitor the current provided by the driver 304 to the coils 204 and 206, respectively.

As shown in FIG. 4, the comparators 402 and 404 can couple between the driver 304 and the coils 204 and 206, respectively, through intermediary hole sensors 406 and 408, respectively. The hole sensors 406 and 408 allow detection of the current between the driver 304 and the coils 204 and 206, respectively, without contacting the load circuits, which in this case are the coils 204 and 206. However, the hole sensors 406 and 408 are not required.

The comparators 402 and 404 compare the current between the driver 304 and the coils 204 and 206, respectively, with a configurable preset current. The configurable preset current is desirably set to the current that normally flows between the drivers 304 and 306 and the coils 204, 206, 208, and 210, when the dielectric etch system is operating normally without malfunction. When the current that flows either between the driver 304 and the coil 204 or between the driver 304 and the coil 206 diverges from the preset current, the output of the comparator 402 or the comparator 404, respectively, is absolutely greater than zero.

Such substantial non-zero current divergence, which can be defined as when the non-zero current exceeds a predetermined threshold, such as zero, indicates that either the driver 304 or one of the coils 204 and 206 is malfunctioning. If the comparator 402 is generating the non-zero current, this means that either the driver 304 or the coil 204 is malfunctioning. If the comparator 404 is generating the non-zero current, this means that either the driver 304 or the coil 206 is malfunctioning. Malfunction of the driver 304 includes driver decay in this case.

When this non-zero current is substantially sufficient, current flows from the comparator in question through a coil 414 of the relay 410 and to ground. The comparators 402 and 404 are connected in parallel with one another with respect to the relay 410. Current flow through the coil 414 of the relay 410 causes a normally open switch 412 of the relay 410 to close. This in turn closes the normally open switch 416, which diverts current from the power supply 302 from the drivers 304 and 306 to a negative voltage, −V, which can be −15 volts. Because the drivers 304 and 306 no longer receive power, they no longer supply current to the coils 204, 206, 208, and 210, effectively turning off the dielectric etch system.

Thus, when a malfunction occurs in a driver or one of the coils, a comparator senses the current discrepancy as compared to normal operation. The resulting current flow from the comparator causes a relay to activate. This closes a normally open switch, which diverts power from the magnet driver circuitry, turning off the dielectric system.

Figure 5:
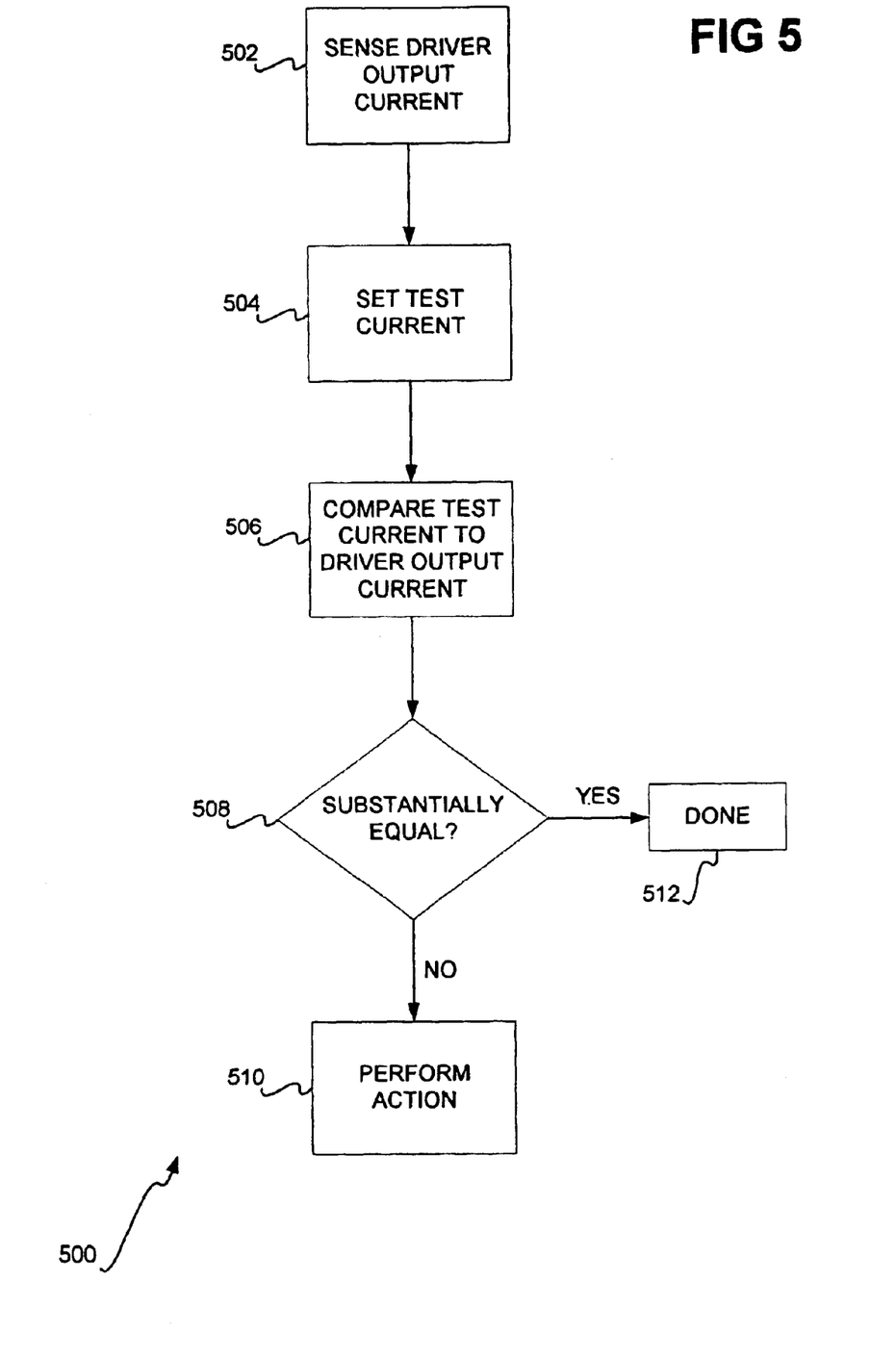
FIG. 5 is a flowchart that can be performed by an embodiment of the invention to directly detect malfunctions with an etch system, such as the etch system of FIG. 2.

FIG. 5 is a flowchart of a method 500 that summarizes the process of the malfunction detection circuitry of the invention. Driver output current is sensed (502). The driver output current is the current that flows between a magnet driver of the dielectric etch system and a coil of the system. A configurable test current is set (504), and is compared to the driver output current (506). This may be accomplished by using a comparator as has been described, where one input to the comparator is the configurable test current, and the other input is the driver output current.

If the two currents are not substantially equal (508), such that they are unequal by more than a predetermined threshold, which may be, for instance, substantially zero, a malfunction action is performed (510). The malfunction action may include turning off power to the dielectric etch system, triggering an alarm, and so on. The malfunction action may be performed by a relay coupling the comparator to ground as a result of non-zero current being output by the comparator. This closes a normally open switch of the relay, which in turn closes another normally open switch that causes the malfunction action to be performed. For example, closing of the latter normally open switch may divert power from the dielectric etch system, turning the system off. The method 500 is then finished (512). If the two currents being compared are substantially equal (508), then the method 500 is also finished (512).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A malfunction detection circuitry for a dielectric etch system comprising:
   a first comparator coupling between a first magnet driver of the dielectric etch system and a first electromagnetic coil of a plurality of coils of the dielectric etch system; and,
   a relay coupling the first comparator to ground and turning off a power source for the dielectric etch system when the first comparator yields a substantially non-zero current, indicating that a malfunction has been detected in one or more of the first magnet driver and the first electromagnetic coil.

2. The malfunction detection circuitry of claim 1, further comprising a second comparator coupling between a second magnet driver of the dielectric etch system and a second electromagnetic coil of the plurality of coils of the dielectric etch system, the second comparator connected in parallel with the first comparator, such that the relay couples the first comparator and the second comparator as connected in parallel with one another to ground and turns off the power source when at least one of the first comparator and the second comparator yields a substantially non-zero current, indicating that a malfunction has been detected in one or more of the first magnet driver, the second magnet driver, the first electromagnetic coil, and the second electromagnetic coil.

3. The malfunction detection circuitry of claim 1, further comprising a first normally open switch coupling the relay to the power source for the dielectric etch system, such that the relay closes the first normally open switch when the first comparator yields the substantially non-zero current.

4. The malfunction detection circuitry of claim 3, wherein the relay further comprises a second normally open switch between the first normally open switch and a negative voltage, such that the substantially non-zero current causes the second normally open switch to close, which in turn causes the first normally open switch to close.

5. The malfunction detection circuitry of claim 1, wherein the first comparator compares current running between the first magnet driver and the first electromagnetic coil to a configurable preset current, such that the first comparator yields the substantially non-zero current when the current running between the first magnet driver and the first electromagnetic coil varies from the configurable preset current by more than a predetermined threshold.

6. The malfunction detection circuitry of claim 5, wherein the predetermined threshold is substantially zero.

* * * * *